United States Patent
Motz et al.

(10) Patent No.: US 11,863,137 B2
(45) Date of Patent: Jan. 2, 2024

(54) CHOPPER SYSTEM AND METHOD

(71) Applicant: Infineon Technologies AG, Neubiberg (DE)

(72) Inventors: Mario Motz, Wernberg (AT); Umberto Aracri, Villach (AT)

(73) Assignee: Infineon Technologies AG, Neubiberg (DE)

( * ) Notice: Subject to any disclaimer, the term of this patent is extended or adjusted under 35 U.S.C. 154(b) by 323 days.

(21) Appl. No.: 17/302,435

(22) Filed: May 3, 2021

(65) Prior Publication Data
US 2021/0344315 A1 Nov. 4, 2021

(30) Foreign Application Priority Data
May 4, 2020 (DE) .......................... 102020111914.3

(51) Int. Cl.
*G01R 33/07* (2006.01)
*H03F 3/38* (2006.01)
*H03M 1/04* (2006.01)

(52) U.S. Cl.
CPC .............. *H03F 3/38* (2013.01); *G01R 33/075* (2013.01); *H03F 2200/459* (2013.01); *H03M 1/04* (2013.01)

(58) Field of Classification Search
CPC ................. H03F 3/38; H03F 2200/459; H03F 2200/261; H03F 3/45475; H03F 3/387; H03F 1/26; H03F 3/45; G01R 33/075; G01R 33/0023; H03M 1/04; H03M 1/0626

USPC ........................................................ 324/251
See application file for complete search history.

(56) References Cited

U.S. PATENT DOCUMENTS

| 7,295,061 | B1* | 11/2007 | Dasgupta | H03F 3/45179 327/124 |
| 9,859,907 | B1 | 1/2018 | Li | |
| 9,912,309 | B1* | 3/2018 | Ecker | H03F 3/45977 |
| 2009/0261821 | A1* | 10/2009 | Motz | G01R 33/075 324/251 |
| 2010/0103015 | A1* | 4/2010 | Yoshida | H03M 1/0663 330/10 |
| 2010/0327887 | A1* | 12/2010 | Denison | H03F 3/45475 324/123 R |
| 2014/0077873 | A1* | 3/2014 | Motz | H03F 3/45977 330/9 |
| 2017/0115330 | A1* | 4/2017 | Motz | G01R 31/343 |
| 2018/0247522 | A1 | 8/2018 | Motz et al. | |
| 2019/0079143 | A1* | 3/2019 | Romero | H03H 17/025 |
| 2019/0149108 | A1* | 5/2019 | Motoroiu | H03L 7/085 330/255 |

OTHER PUBLICATIONS

Hanasusanto, Grani A., and Yuanjin Zheng. "A chopper stabilized pre-amplifier for biomedical signal acquisition." 2007 International Symposium on Integrated Circuits. IEEE, 2007. (Year: 2007).*

* cited by examiner

Primary Examiner — Christopher P McAndrew
(74) Attorney, Agent, or Firm — Harrity & Harrity, LLP (57) ABSTRACT

Systems and methods are provided for which a chopper modulator and a chopper demodulator of a chopped apparatus having a variable chopper frequency are described. A feedback path is used to reduce ripples and/or remaining offsets as a result of the variable chopper frequency.

14 Claims, 7 Drawing Sheets

CHOPPER SYSTEM AND METHOD

CROSS REFERENCE TO RELATED APPLICATION

This application claims priority to German Patent Application No. 102020111914.3, filed on May 4, 2020, the contents of which are incorporated by reference herein in their entirety.

TECHNICAL FIELD

The present application concerns systems that employ chopping, and corresponding methods.

BACKGROUND

Chopping is a technique that involves an input signal and an output signal of an apparatus each being modulated with a chopper signal that has a chopper frequency. The apparatus can be an analog-to-digital converter or an amplifier, for example, and is referred to generally as a chopped apparatus in this application. By way of example, such a chopper signal can alternately assume values of +1 and −1 at a chopper frequency, and the input signal and the output signal of the chopped apparatus are multiplied by this signal for the purpose of modulation.

This chopping eliminates a DC voltage offset of the chopped apparatus or at least decreases it. However, chopping produces a ripple at the chopper frequency. To eliminate these ripples, conventional approaches use a lowpass filter or notch filter, which can mean additional implementation outlay, additional delay times and undesirable stabilization or overshoot behavior. Such a filter can moreover result in interference signals at multiples of the chopper frequency. This can occur in the event of undesirable interference injection at the output of a chopper arrangement and can lead to undesirable demodulation effects that can distort the useful signal in the DC component or in the useful frequency range, in particular in the case of systems with radio-frequency interference from the surroundings of the system.

Some approaches involve the chopper frequency being varied randomly or pseudorandomly in order to decrease such interference signals at multiples of the chopper frequency. However, this has the disadvantage that offset components are not completely up-modulated to a fixed chopper frequency and cannot subsequently be selectively filtered out, but rather mixed frequencies lead to aliasing (down-demodulation), which can manifest itself as an increase in noise in the useful signal. These mixed frequencies arise as a result of the constantly changing chopper frequency.

BRIEF DESCRIPTION

In one example implementation a system is provided, comprising: a chopped apparatus having a chopper modulator at an input and a chopper demodulator at an output, a device for providing a chopper signal having a variable chopper frequency to the chopper modulator and the demodulator, and a feedback path from an output of the chopper demodulator to the chopped apparatus, configured to reduce ripples and/or offsets caused by the variable chopper frequency.

In a further example implementation a method is provided, comprising:

providing a chopper signal having a variable chopper frequency to a chopper arrangement, and providing feedback from an output of the chopper arrangement to a chopped apparatus in order to compensate for ripples or offsets caused by the variable chopper frequency.

The above summary is merely a brief overview of some implementations and should not be interpreted as restrictive, since other implementations can have different features than those discussed above.

DETAILED DESCRIPTION

Various example implementations are explained in detail below. These example implementations serve merely for illustration and should not be interpreted as restrictive. While specific implementation details are described in some example implementations, other implementations having other features (for example components, method sequences, elements and the like) can also be used in other example implementations.

Features of different example implementations can be combined with one another, unless indicated otherwise. Variations and variant forms that are described for one of the example implementations can also be applied to other example implementations and are therefore not explained repeatedly. In addition to the features explicitly depicted and described, other features, for example features used in conventional systems having chopped apparatuses, can be provided.

Connections and couplings that are described here are electrical connections or couplings unless explicitly indicated otherwise. Such connections or couplings can be modified so long as the fundamental way in which the connection or coupling works remains substantially unchanged.

Figure 1:
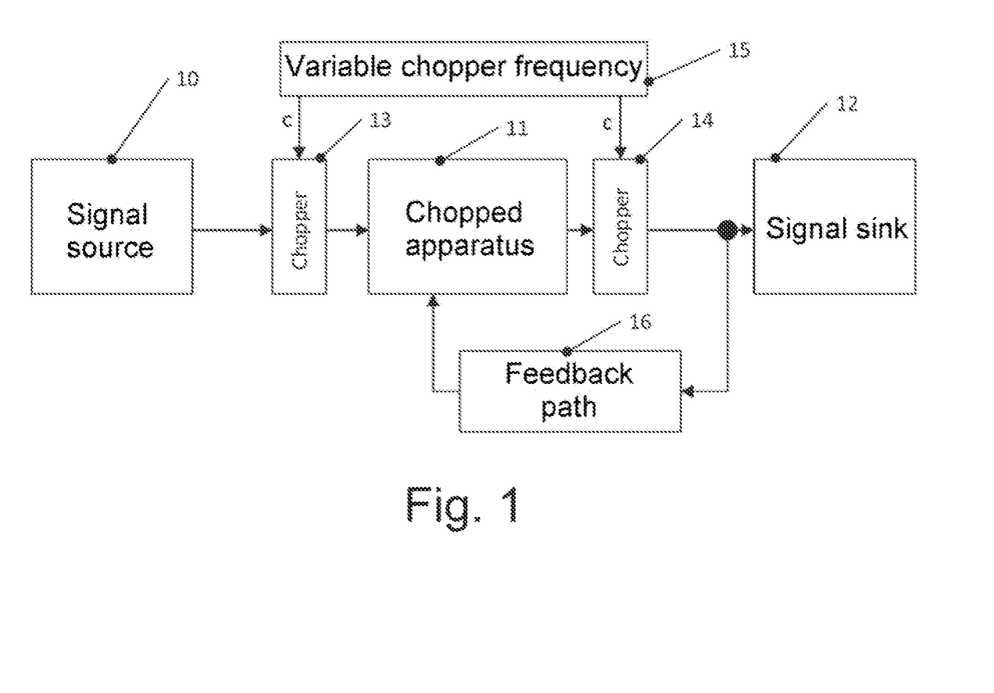
FIG. 1 is a block diagram of a system according to an example implementation.

FIG. 1 shows a system according to an example implementation.

The system of FIG. 1 comprises a signal source 10. The signal source 10 can have for example a sensor for capturing a physical quantity and possibly further components such as filters and amplifiers for processing a signal that is output by the sensor. Other types of signal sources, for example audio signal sources, can also be used.

A signal from the signal source 10 is supplied to a chopped apparatus 11. The chopped apparatus 11 has a chopper modulator 13 at its input and a chopper demodulator 14 at its output. The chopped apparatus 11 can be any type of apparatus in which chopping is conventionally used, for example an analog-to-digital converter for converting an analog signal that is output by the signal source 10 into a digital signal, or an amplifier in order to amplify the signal delivered by the signal source 10. An output signal of the chopped apparatus 11 is supplied to a signal sink 12 following demodulation by the chopper demodulator 14.

In the case of a signal source 10 that comprises a sensor, the sensor signals can then be processed further in the signal sink 12, for example, and other apparatuses can be controlled based on the sensor signals, for example. Other types of signal sinks that process signals from a signal source can likewise be used.

The system of FIG. 1 additionally has a device 15 for generating a chopper signal c having a variable chopper frequency fchop. The signal c can alternately have values of +1 and −1, for example, by which the signal from the signal source 10 is multiplied in the chopper modulator 13 and the signal from the chopped apparatus 11 is multiplied in the chopper demodulator 14. Other signal sequences used in conventional choppers can also be used. The chopper signal c has a variable chopper frequency, that is to say that for example the change from +1 to −1 (or other signal values of the chopper signal c) does not take place at a fixed frequency, but rather varies about a certain frequency. This variation can occur according to a predefined scheme (that is to say a predefined succession of frequencies), randomly or pseudorandomly. Possible implementations of such pseudorandom generation of a variable chopper frequency will be explained later with reference to FIGS. 4 to 6. The use of a variable chopper frequency of this kind allows interference signals at high frequencies to be decreased, for example distributed over a larger frequency range, resulting in lower intensity. Without further measures, however, a ripple or an offset in the output signal that is supplied to the signal sink 12 would remain, or would increase as a result of the variable chopper frequency.

To suppress or decrease such effects, a feedback path 16 from the output of the chopper demodulator 14 to the chopped apparatus 11 is furthermore provided in the system of FIG. 1. The feedback path 16 is used to adjust an offset of the chopped apparatus 11. The possibility of adjusting an offset is already afforded by many chopped apparatuses such as analog-to-digital converters or amplifiers. In the case of analog-to-digital converters, it can be done by adding or subtracting an adjustable digital value of the output; in the case of amplifiers, it can be done by setting a bias voltage of the amplifier, for example. In other example implementations, an input signal of the chopped apparatus 11 can also be modified using a signal from the feedback path.

The feedback path can be analog, digital or a mixture of the two and, by processing the signal that is output by the chopper demodulator 14, can generate a compensation signal that can be used to eliminate or at least decrease such ripples and remaining offsets as a result of the variable chopper frequency. To this end, the feedback path can have an integrator. The feedback path can have a filter function that rejects all or some of the useful signal of the system (e.g. the useful signal coming from the signal source 10 and processed by the chopped apparatus 11) and passes the ripples and/or offsets generated by the variable chopper frequency, which means that the chopped apparatus 11 can be controlled in the opposite sense based on these ripples and/or offsets so as then to reject them at the output of the system.

If the chopped apparatus 11 is an amplifier having an open gain of G, for example, a feedback function H on the amplifier leads to an inverse function G/(1+GH) at the amplifier output. If the gain G is high enough, this leads to a response that is approximately proportional to 1/H. If the feedback signal now represents ripples and/or offsets, these can be rejected. Since the useful signal is rejected in the feedback path, on the other hand, the useful signal at the output of the amplifier is influenced little by the feedback.

This combination of variable chopper frequency and feedback path allows the advantages of the variable chopper frequency, in particular decreased interference at multiples of a fixed chopper frequency, to be used and at the same time allows ripples and the offset to be greatly reduced to or close to zero. Additionally, the modulation effects in downstream systems such as the signal sink 12 can be decreased, and filtering-out of useful signals close to the chopper frequency can be reduced. Without the feedback path 16, on the other hand, the use of the variable chopper frequency would entail the disadvantages described at the outset. There may be no need for a lowpass filter or notch filter at the output of the chopper 14, and the associated disadvantages do not arise. Additionally, a sensitivity toward radio-frequency interference signals can be decreased. The feedback path 16 also allows an increase in noise in the useful signal range that is associated with a variable chopper frequency in conventional approaches to be decreased or avoided.

As explained above, the feedback path 16 leads to effective filtering of the output signal. In some example implementations, a filter frequency of this filtering (for example a cutoff frequency of a lowpass filtering for filtering out the useful signal as described above) by the feedback path is lower than a repetition rate of the variable chopper frequency by at least a factor of 2. This repetition rate indicates how quickly the succession of frequencies repeats in the case of a pseudorandom sequence or a predefined order. This can increase a stability of the system in some implementations, in particular can lead to a signal that is output by the feedback path 16 being controlled to a stable value better. In particular, this leads to the feedback path not being able to follow the changing chopper frequencies. This can have the additional effect that a useful signal close to the chopper frequency is rejected less.

Additionally or alternatively, the filter frequency can be lower than a minimum chopper frequency of the variable chopper frequency by at least a factor of 2.

In some example implementations, the frequency range in which the variable chopper frequency of the chopper signal c varies is above a useful signal range, that is to say a frequency range of the signal that is output by the signal source 10. This can prevent the energy of ripples in the useful signal range from increasing. Above the useful signal range, a comparatively wide frequency range is used in some example implementations in order to distribute energy at multiples of the chopper frequency as widely as possible. By way of example, a useful frequency range can extend up to 200 kHz, and a mid-range chopper frequency can be 300 kHz, the variable chopper frequency varying between 200 kHz and 400 kHz. In such a case, the feedback path can then have a filter frequency lower than 100 kHz. These numerical examples serve only for illustration, however, and other values are also possible, depending on the implementation.

Figure 2:
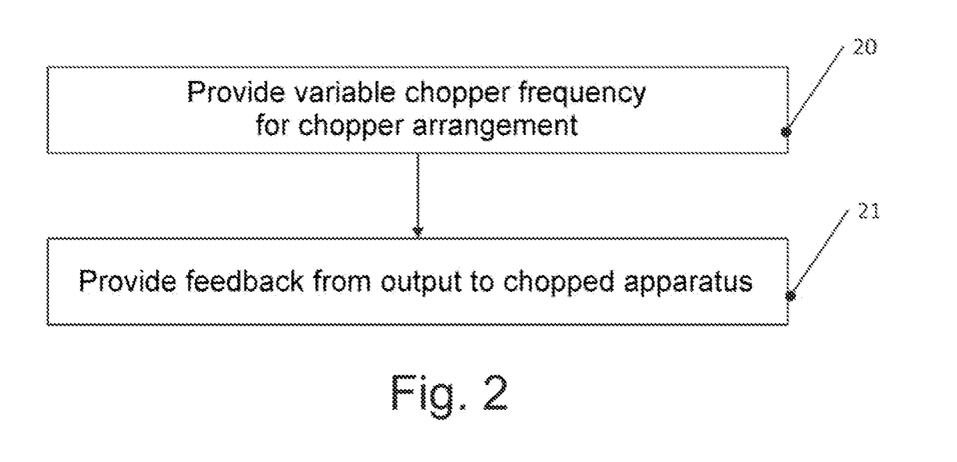
FIG. 2 is a flowchart to explain methods according to some example implementations.

FIG. 2 shows a flowchart to illustrate methods according to some example implementations. The method of FIG. 2 can be implemented in the system of FIG. 1, for example, and is described with reference thereto in order to avoid repetition. The method of FIG. 2 can also be implemented in other systems, however, for example the systems described below, and is therefore not limited to a specific apparatus. While the method of FIG. 2 is described using two parts at 20 and 21, the processes described can essentially be performed simultaneously, as is also the case in FIG. 1.

In step 20, a chopper arrangement, for example the chopper modulator 13 and the chopper demodulator 14, is provided with a chopper signal having variable chopper frequency, such as for example the chopper signal c of FIG. 1. At 21 feedback from an output to the chopped apparatus is provided, for example in order to set an offset of the chopped apparatus, as was described for the feedback path 16 of FIG. 1.

Figure 3A:
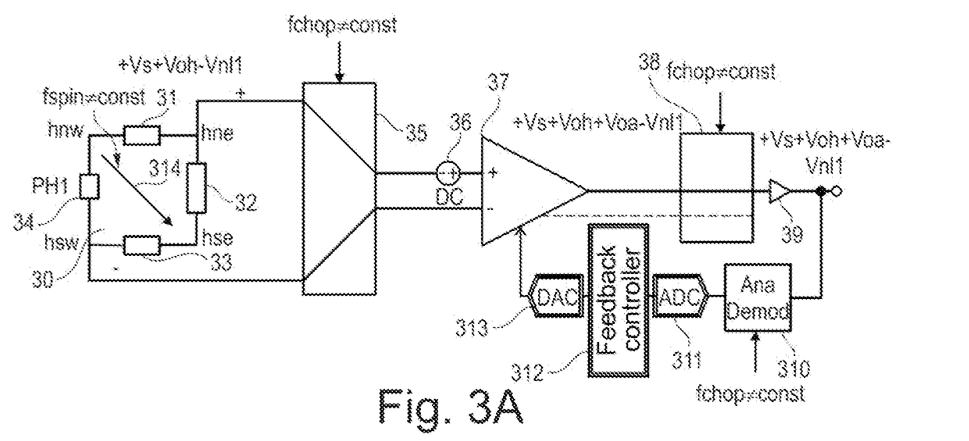
FIGS. 3A-3D show an apparatus according to an example implementation in four different operating phases.
Figure 3B:
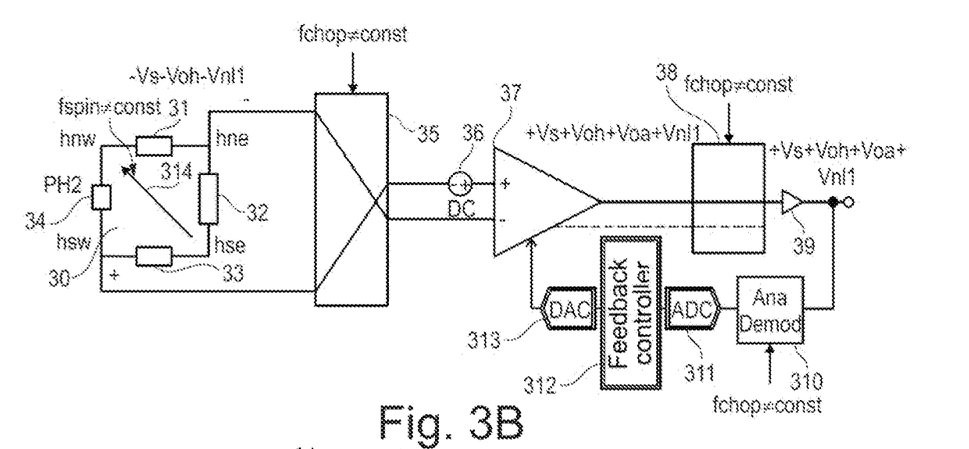
Figure 3C:
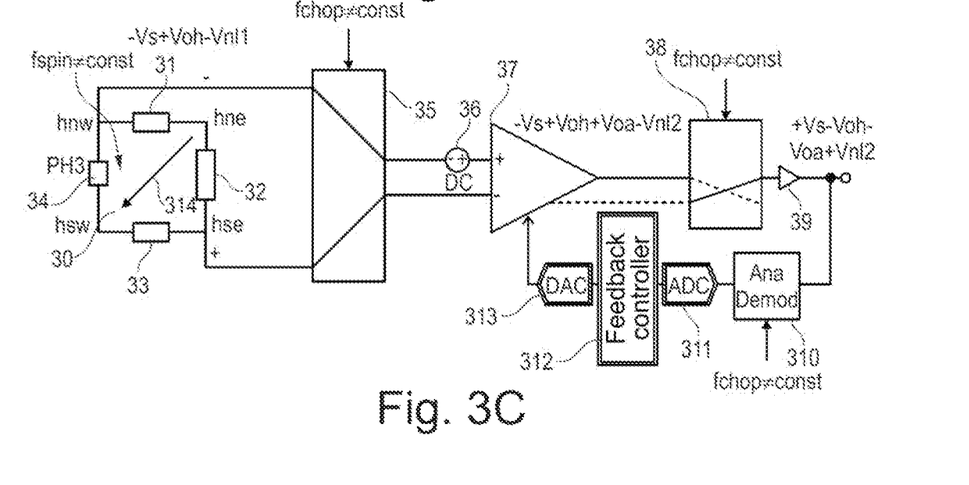
Figure 3D:
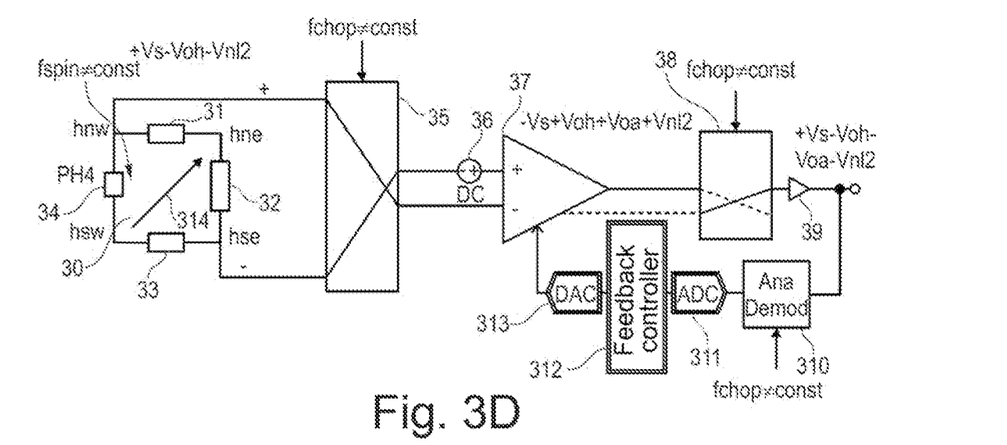

FIGS. 3A to 3D show a system according to a further example implementation, in which the techniques discussed with reference to FIGS. 1 and 2 are applied to a specific case of processing a signal from a Hall sensor operated using a spinning current technique. The spinning current technique involves connections of a Hall sensor, which are supplied with a bias current, and connections at which a Hall voltage is tapped off being cyclically interchanged, which can be used to compensate for offsets of the Hall sensor. FIGS. 3A to 3D show the application of a four-phase spinning current technique, each of FIGS. 3A to 3D showing one phase, denoted by PH1 to PH4 in the figures. The apparatus is first described with reference to FIG. 3A. The same apparatus is shown in FIGS. 3B to 3D, just for other phases.

The apparatus of FIG. 3 has a Hall sensor 30, which is symbolized by a circuit comprising four resistors 31 to 34. Nodes between the resistors are denoted by hnw, hne, hse and hsw.

When a bias current is applied between two opposite nodes, a Hall voltage can be tapped off between the other two nodes. In the figures, an arrow 314 indicates the respective applied bias current, in the case of FIG. 3A from the node hnw to the node hse. A Hall voltage is then accordingly tapped off between the nodes hne and hsw in the case of FIG. 3A, and supplied to a chopper modulator 35. An output of the first chopper 35 is connected to a differential amplifier 37 via a DC voltage coupling 36, which transmits DC components of the output signal of the chopper modulator 35. The differential amplifier 37 is an example of a chopped apparatus.

An output signal of the differential amplifier 37 is supplied to a chopper demodulator 38. An output signal of the chopper demodulator 38 is buffered in an operational amplifier 39 and output. Secondly, the output signal is supplied to a feedback path comprising an analog demodulator 310, an analog-to-digital converter 311, a feedback controller 312 and a digital-to-analog converter 313. An output signal of the digital-to-analog converter 313 changes an offset of the differential amplifier 37.

During operation, a chopper signal having a nonconstant chopper frequency fchop (symbolized by "fchop≠const") is applied to the chopper modulator 35 and the chopper demodulator 38. In sync therewith, the spinning current method is also operated at a nonconstant frequency fspin, which can be an integer multiple of fchop (for example 2*fchop).

In phase 1 of FIG. 3A the bias current is applied between the connections hnw and hse, as already explained, and the Hall voltage is tapped off between the connections hne and hsw. This results in a voltage +Vs+Voh−Vnl1, where Vs is the voltage that is actually to be measured, which is caused by a magnetic field, Voh is an offset of the Hall sensor 30 and Vnl1 is a voltage that is produced as a result of the resistors 31 to 34 not exhibiting the same response and is caused here by the resistor 32. This voltage is amplified by the differential amplifier 37, with an offset Voa of the amplifier 37 additionally being added. A voltage +Vs+Voh+Voa−Vnl1 is then present at the output of the chopper 38. The output signal is once again demodulated at the chopper frequency in the demodulator 310, and the feedback controller 312 is then used to set the offset of the differential amplifier 37 based on this modulated signal. This feedback path can essentially operate as described for the feedback path 16 above, which means that the feedback controller 312 is used to reject the useful signal and the differential amplifier 37 is then controlled based on the ripples and/or offsets.

Lines in the chopper modulator 35 show examples of the connections between the Hall sensor 30 and the differential amplifier 37 in each phase PH1 to PH4. In essence, this is implemented in the depicted example implementation such that Voh (half-bridge offset) and Voa (amplifier offset) are in sync, whereas the arithmetic sign of the signal Vs changes, on the other hand, so that, as described below, in the end the two can be separated and offsets can be rejected. Lines in the chopper demodulator 38 show the connections between the differential amplifier 37 and the output of the system (or a positive output, if a differential output is implemented).

In phase 2 of FIG. 3B the bias current is applied between the connections hsw and hne, that is to say in the opposite direction to that in phase 1 of FIG. 3A, and the output signal is accordingly −Vs−Voh−Vnl1. The output signal obtained from the differential amplifier 37 is +Vs+Voh+Voa+Vnl1, and the output signal obtained from the chopper demodulator 38 is +Vs+Voh+Voa+Vnl1. In the phases of FIGS. 3C and 3D the bias current 314 is then applied between the connections hne and hsw, with different polarity, and the Hall voltage is tapped off between the connections hne and hsw. This results in an output voltage +Vs−Voh−Voa+Vnl2 in the case of FIG. 3C and also in an output signal +Vs−Voh−Voa−Vnl2 in the case of FIG. 3D. If the four output signals are added, the components of Voh and Voa compensate for one another, and a value of 4 Vs is left.

The above description initially applies to constant (DC) signals averaged over time. Here already there remains an AC component (AC) at the up-modulating chopper frequency (e.g. the component of Voa disappears when averaged over time, but it appears at the output as AC voltage signal with +Voa and −Voa. The alternating frequency between +Voa/−Voa is the same as the chopper frequency.

The feedback path 310 to 313 now operates as negative feedback for this AC voltage signal in the differential amplifier 37, as a result of which the AC component at the output of the sensor disappears following stabilization of the feedback path (in accordance with its filter frequency).

The variable chopper frequency in conjunction with the feedback can additionally achieve interference signals at higher frequencies in the event of simultaneous rejection of an offset or a ripple caused by the variable chopper frequency.

Figure 4A:
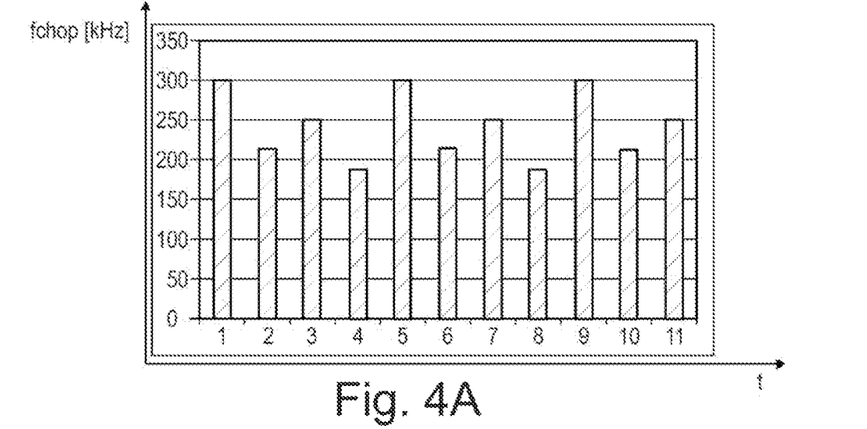
FIGS. 4A and 4B show graphs to illustrate a variable chopper frequency.
Figure 4B:
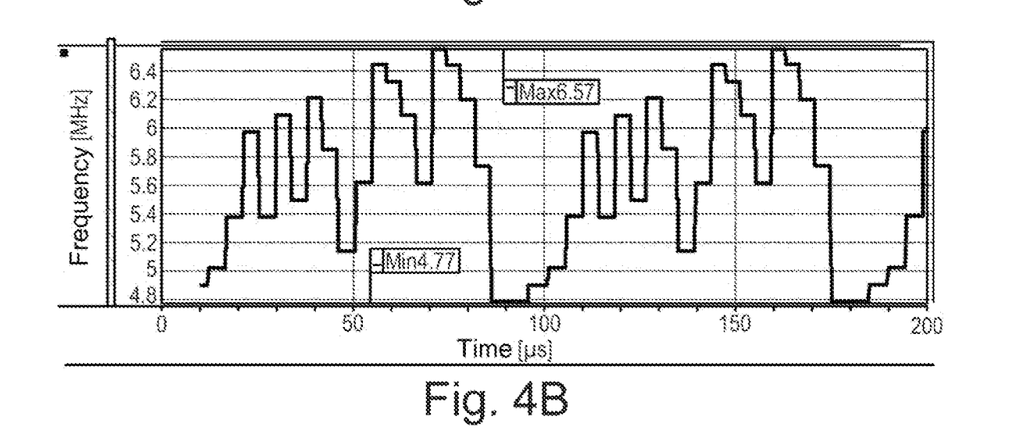

FIGS. 4A and 4B show examples of variable chopper frequencies over time, the chopper frequency being plotted over time in each case. In FIG. 4A, eleven periods of the chopper signal 1 to 11 are plotted over time, at frequencies between 300 and 180 kHz. Such frequencies can be generated using a pseudorandom number generator, for example. Another example of variable frequencies is depicted in FIG. 4B. Here the pattern of frequencies repeats after a certain time, two repetitions being shown in FIG. 4B. This repetition thus has a repetition rate, which was explained above.

Ways of generating variable chopper frequencies will now be explained.

Figure 5A:
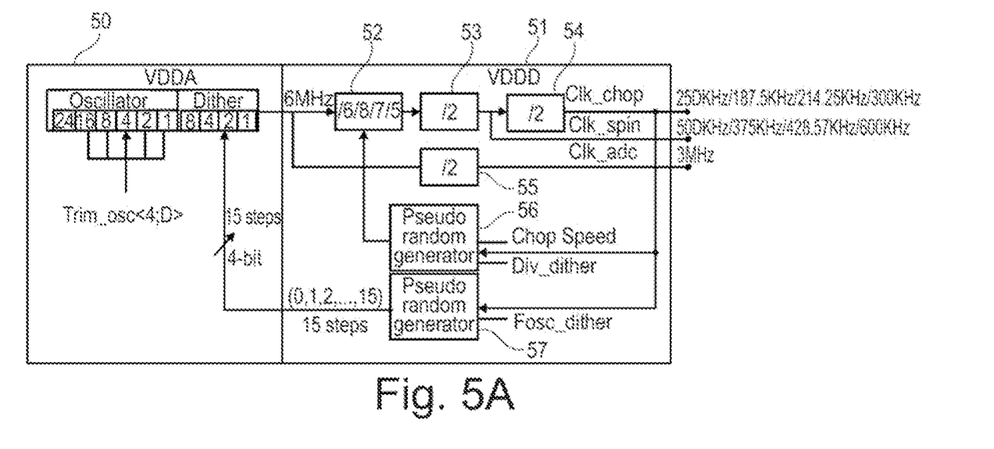
FIG. 5A is a block diagram to illustrate the way in which some example implementations work.

FIG. 5A shows an apparatus having an oscillator section 50, which is supplied with a supply voltage VDDA, and a section 51, which is supplied with a supply voltage VDDD and has frequency dividers 52 to 55 and pseudorandom generators 56 and 57. One way of generating a chopper signal having variable chopper frequency is to supply a random sequence from the pseudorandom generator 57 to a dither register of the oscillator section, as a result of which the frequency thereof is varied. This can be done for example by selecting binary-weighted current sources in accordance with the dither register for an integrator current of a relaxation oscillator. In the case of a digitally controlled oscillator (DCO), the dither register can be part of the control word and can therefore likewise vary the frequency. Otherwise, a frequency is set by a signal Trim_OSC. The oscillator section 50 can output for example a signal having a frequency of around 6 MHz, possibly varied by the control of the dither register.

In addition or as an alternative to the variation using the dither register, an output signal of the pseudorandom generator 56 can control a variable frequency divider 52 that variably divides the frequency of its input signal by a factor of between 5 and 8 (5, 6, 7, 8 in the example depicted) and therefore generates variable frequencies. In the example implementation of FIG. 5A the variable frequency divider also has fixed frequency dividers 53, 54 connected downstream of it for dividing the frequency by two, in order to generate a chopper signal Clk_chop that, in the numerical example, can have frequencies of 250 kHz, 187.5 kHz, 214.28 kHz or 300 kHz. Between the dividers 53 and 54, a signal Clk_spin is additionally also branched off, which can be used as clock signal for a spinning current method and has twice the frequency of the signal Clk_chop. Additionally, the oscillator signal is supplied directly to a frequency divider 55 that divides the signal by two in order to generate a signal Clk_adc, which can be used for example as clock signal for an analog-to-digital converter.

All numbers in the example of FIG. 5A serve merely for illustration, and it is also possible for other values, other numbers of frequency dividers or other division ratios to be used. Additionally, the dither register of the oscillator section 50 and the variable frequency divider 52 can be used jointly, but also independently of one another, in order to generate a variable chopper frequency.

Figure 5B:
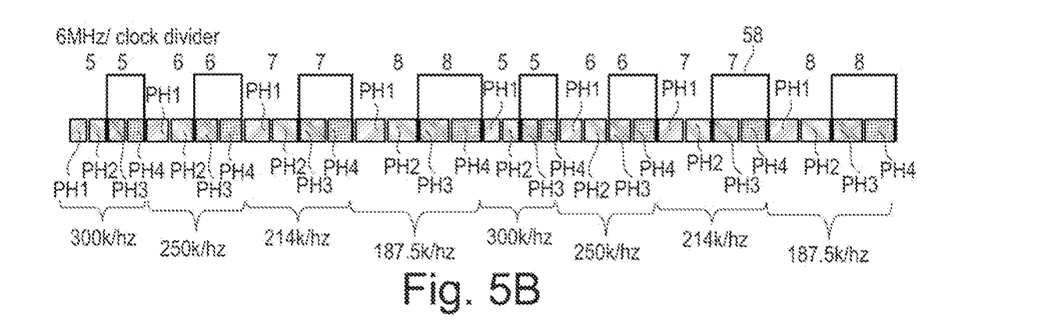
FIG. 5B is an example of signals generated using the apparatus of FIG. 5A.

FIG. 5B shows an example of signals that can be generated using the apparatus of FIG. 5A without the dither register, but with the variable frequency divider 52. A curve 58 in FIG. 5B shows an example of the chopper signal Clk_chop, the division ratio of the variable frequency divider 52 being shown at the top. Additionally, the phases of the spinning current technique are indicated according to the signal Clk_spin operating at twice the frequency. This too serves merely as an illustrative example.

Figure 6:
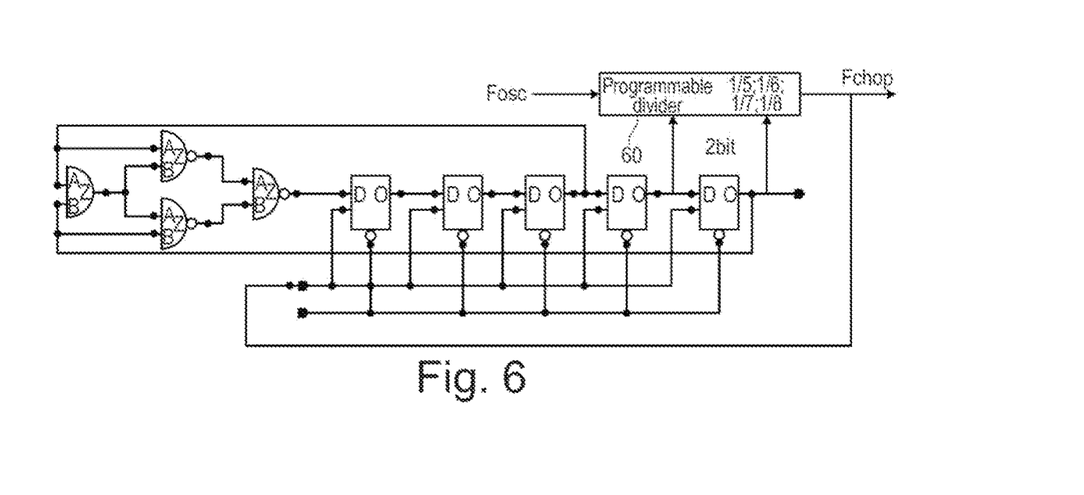
FIG. 6 is a circuit diagram of an apparatus for generating a chopper signal having a pseudorandom chopper frequency.

FIG. 6 shows an example of a pseudorandom generator that is implemented with a chain of shift registers and controls a programmable frequency divider 60, which can correspond to the variable frequency divider 52 of FIG. 5A, so as to generate a signal having a variable chopper frequency fchop from an oscillator signal fosc. Other implementations of pseudorandom number generators can likewise be used.

Figure 7:
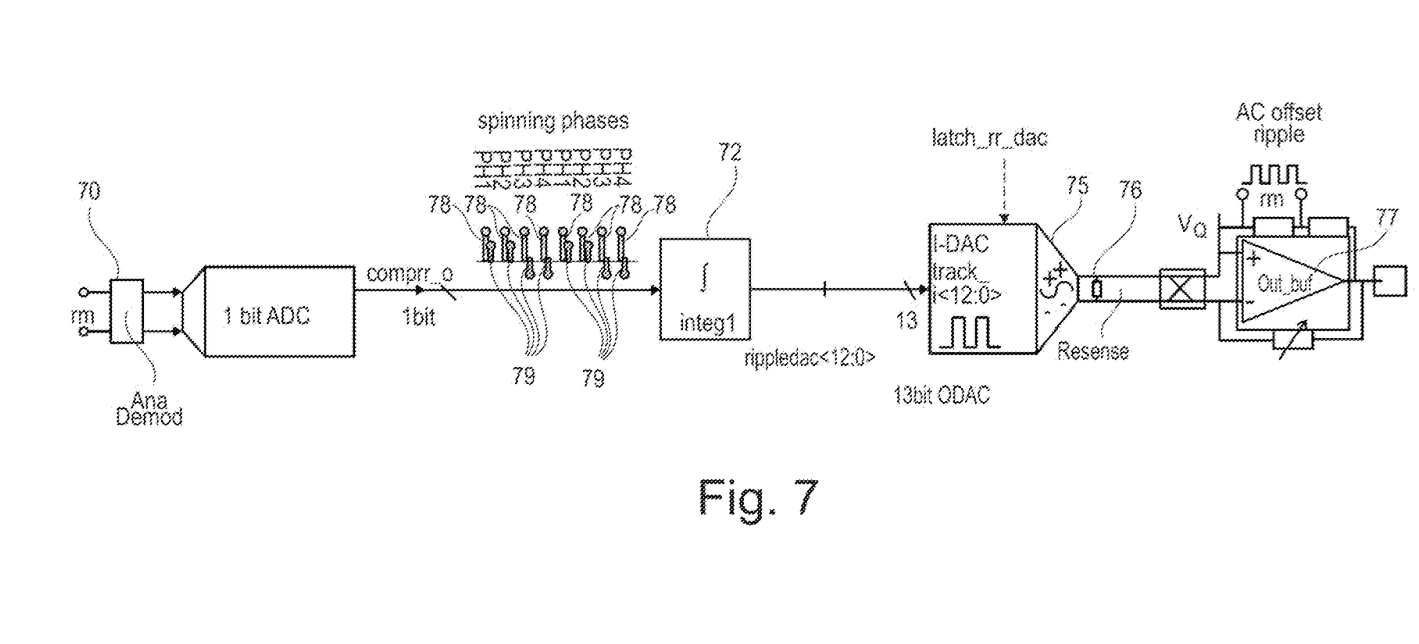
FIG. 7 is a diagram of an implementation example of a feedback path.

FIG. 7 shows an implementation example of a feedback path as can be used in the example implementation of FIG. 3.

The feedback path of FIG. 7 receives an output signal rm from a chopped apparatus downstream of a chopper demodulator (and possibly downstream of an amplification as by the operational amplifier 39 of FIG. 3) at a demodulator 70, the operation of which corresponds to that of the analog demodulator 310 of FIG. 3C. An output signal of the demodulator 70 is supplied to an analog-to-digital converter 71, which in the depicted example is a 1-bit analog-to-digital converter, that is to say an analog-to-digital converter that outputs a 1-bit signal. The output signal is denoted by comprr_o in FIG. 7. An example of this signal for multiple phases of the spinning current method is depicted (PH1 to PH4 twice).

The signal comprr_o is supplied to an integrator 72, which can be implemented as a simple up/down counter and counts either upward or downward depending on the value of the signal comprr_o.

In order to illustrate the operation of the integrator, amplitudes 78 of the example signal show e.g. the offset signal of the amplifier Voa in the phases PH1 to PH4. Amplitudes 79 show the useful signal in the phases PH1 to PH4. Since the useful signal appears sometimes positive, sometimes negative in equal proportions, the useful signal is averaged and hence rejected in the integrator 72, while the Voa components (offset) according to the amplitudes 78 keep on being integrated upward.

During operation of the respective chopped apparatus (an amplifier 77 in the case of FIG. 7) using the feedback path the upward integration comes to an end when the undesirable component in the output signal disappears as a result of the negative feedback caused by the feedback path. The system adapts to this.

The signal that is output by the integrator 72 can be a 12-bit signal, for example. An output signal of the integrator 72 is supplied to a digital-to-analog converter, in the depicted example a 13-bit ODAG (objective digital-to-analog converter). The signal thus generated is then overlaid via a resistor 76 on an input of the amplifier 77, which is an example of a chopped apparatus. Here, the signal of the feedback signal is thus fed in at the input of the amplifier 77, which effectively likewise changes the offset of the amplifier 77. A signal "Ripple meas" is then in turn tapped off from the amplifier as input signal for the feedback path. This can also be done at an output of the amplifier 77 or downstream of a chopper demodulator as explained above.

FIG. 7 shows only one possible implementation of a feedback path, and other implementations, for example implementations as are similarly also used in systems having constant chopper frequency, can be used.

Figure 8:
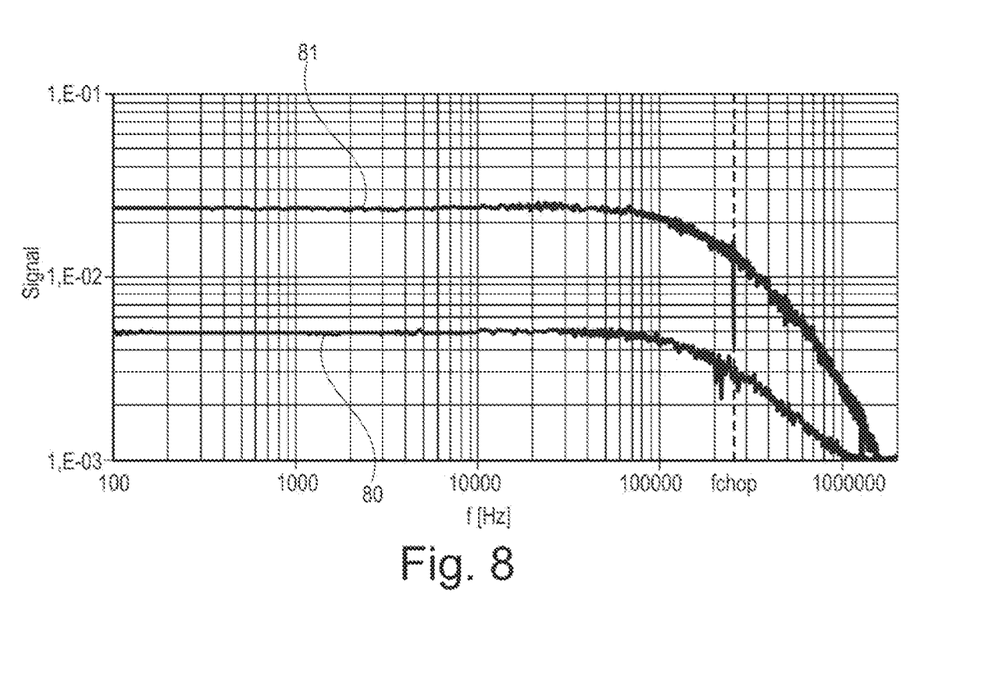
FIGS. 8-10 are graphs to illustrate the effects of some example implementations compared to conventional systems.

The effect of apparatuses discussed here will now also be illustrated with reference to FIGS. 8 to 10. The exact shape of the depicted curves is dependent on the respective implementation, which means that the depicted curves should be understood merely as an example. FIG. 8 shows a signal characteristic of an output signal of a system such as the system of FIG. 3 for a fixed chopper frequency in a curve 81 and for a variable chopper frequency in a curve 80. As can be seen, the rejection of the signal in the case of the fixed chopper frequency fchop is very great (visible as a distinct downward peak). With variable chopper frequency, which varies about fchop, the rejection of the signal close to fchop is less (visible by virtue of smaller and distributed downward peaks). This lesser rejection stems from the fact that each chopper frequency appears only for a short time.

Figure 9:
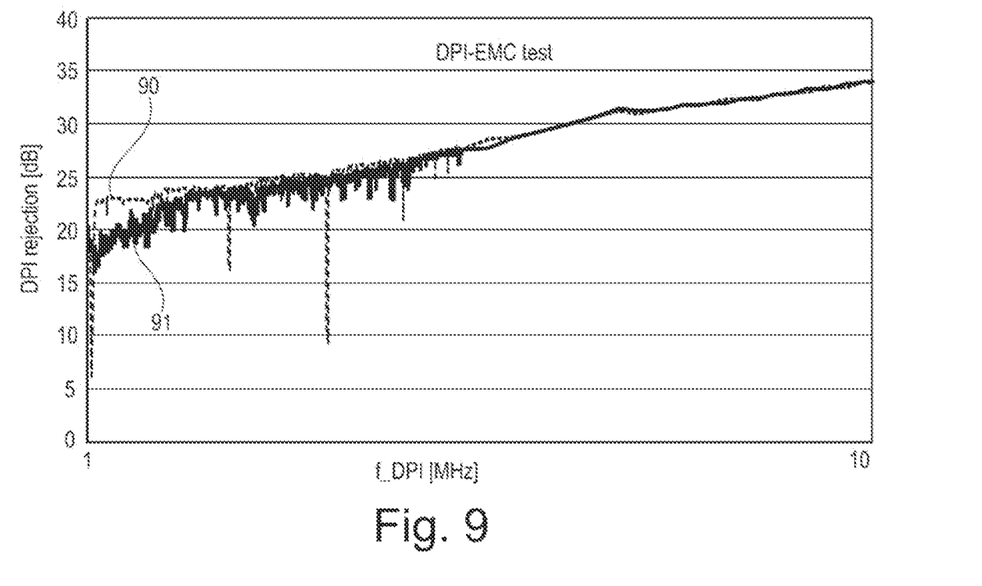

As can additionally be seen in a curve in FIG. 9, in particular susceptibilities to interference at specific high frequencies are much more pronounced in a curve 90 having constant chopper frequency than in a curve 91 having random chopper frequency.

Figure 10:
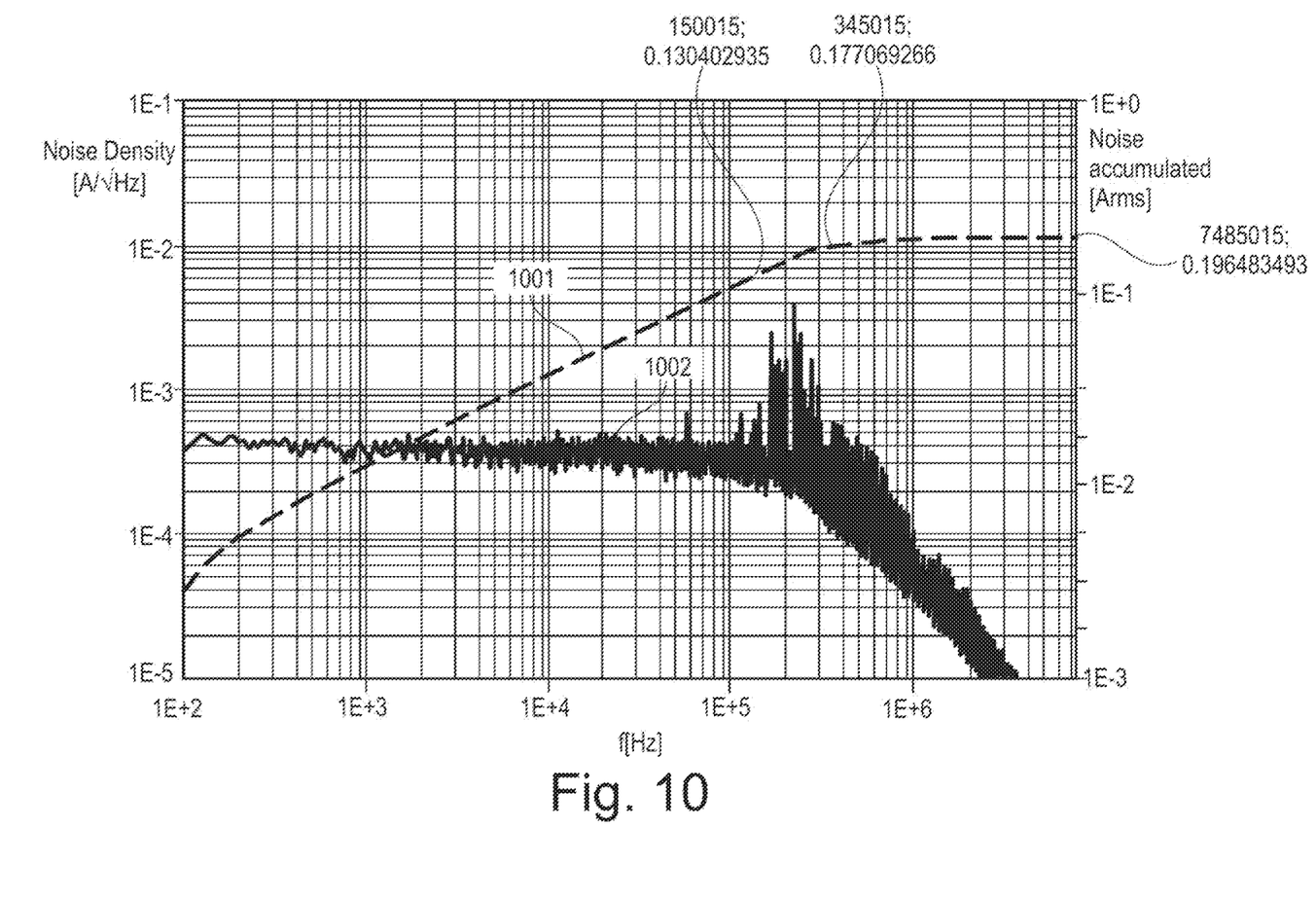

Moreover, a curve 1002 in FIG. 10 shows a noise density and a curve 1001 shows an accumulated noise density, for which, in particular at high frequencies, much smaller spikes occur than in the case of conventional methods and in particular no frequencies are highly prominent. In curve 1001, it can be seen that remaining ripples produce no abrupt increase close to the chopper frequency, but rather only a rise of 10 dB/dec in accordance with the bandwidth, as is theoretically predictable. If just a variable chopper frequency without feedback is used, ripples would undesirably manifest themselves at high frequencies and amplify the total accumulated noise. Thus, remaining ripples that arise as a result of chopping using variable chopper frequency are also significantly reduced by the feedback.

Some example implementations are defined by the examples that follow:

Example 1. System, comprising:
a chopped apparatus having a chopper modulator at an input and a chopper demodulator at an output,
a device for providing a chopper signal having a variable chopper frequency to the chopper modulator and the chopper demodulator, and
a feedback path from an output of the chopper demodulator to the chopped apparatus, configured to reduce ripples or offsets caused by the variable chopper frequency.

Example 2. System according to example 1, wherein an output signal of the feedback path is configured to set an offset of the chopped apparatus.

Example 3. System according to example 1 or 2, wherein the variable chopper frequency has a repetition rate at which chopper frequencies repeat, and wherein the feedback path has a filter frequency that is lower than the repetition rate by at least a factor of 2.

Example 4. System according to one of examples 1 to 3, wherein the variable chopper frequency is in a frequency range above a useful frequency range of the chopped apparatus.

Example 5. System according to one of examples 1 to 4, wherein the feedback path has a filter frequency that is lower than a minimum chopper frequency of the variable chopper frequency by at least a factor of 2.

Example 6. System according to one of examples 1 to 5, wherein the feedback path comprises a demodulator, which is configured to operate based on the chopper signal, and an integrator.

Example 7. System according to one of examples 1 to 6, moreover comprising a spinning current Hall sensor, wherein an output of the spinning current Hall sensor is coupled to an input of the chopper modulator, wherein the spinning current Hall sensor is configured to be operated at a variable spinning frequency that is an integer multiple of the variable chopper frequency.

Example 8. Method, comprising:
providing a chopper signal having a variable chopper frequency to a chopper arrangement, and
providing feedback from an output of the chopper arrangement to a chopped apparatus in order to compensate for ripples or offsets caused by the variable chopper frequency.

Example 9. Method according to example 8, wherein the feedback is configured to set an offset of the chopped apparatus.

Example 10. Method according to example 8 or 9, wherein the variable chopper frequency has a repetition rate at which chopper frequencies repeat, and
wherein the feedback has a filter frequency that is lower than the repetition rate by at least a factor of 2.

Example 11. Method according to one of examples 8 to 10, wherein the variable chopper frequency is in a frequency range above a useful frequency range of a chopped apparatus, which useful frequency range is associated with the chopper arrangement.

Example 12. Method according to one of examples 8 to 11, wherein the feedback has a filter frequency that is lower than a minimum chopper frequency of the variable chopper frequency by at least a factor of 2.

Example 13. Method according to one of examples 8 to 12, wherein the providing of the feedback comprises demodulating an output signal of the chopper arrangement based on the chopper signal, and integrating the demodulated output signal.

Example 14. Method according to one of examples 8 to 13, moreover comprising operating a Hall sensor using a spinning current technique, wherein an output of the Hall sensor is coupled to an input of the chopper arrangement, wherein the spinning current technique is operated at a variable spinning frequency that is an integer multiple of the variable chopper frequency.

Although this description has illustrated and described specific example implementations, persons with standard knowledge in the art will recognize that a multiplicity of alternative and/or equivalent implementations can be selected as substitution for the specific example implementations that are shown and described in this description, without departing from the scope of the implementation shown. The intention is for this application to cover all adaptations or variations of the specific example implementations that are discussed here. It is therefore intended that this implementation be limited only by the claims and the equivalents of the claims.

The invention claimed is:

1. A system, comprising:
   a chopped apparatus having a chopper modulator at an input and a chopper demodulator at an output,
   a device for providing a chopper signal having a variable chopper frequency to the chopper modulator and the chopper demodulator, and
   a feedback path from an output of the chopper demodulator to the chopped apparatus, configured to reduce ripples or offsets caused by the variable chopper frequency.

2. The system as claimed in claim 1, wherein an output signal of the feedback path is configured to set an offset of the chopped apparatus.

3. The system as claimed in claim 1, wherein the variable chopper frequency has a repetition rate at which chopper frequencies repeat, and
   wherein the feedback path has a filter frequency that is lower than the repetition rate by at least a factor of 2.

4. The system as claimed in claim 1, wherein the variable chopper frequency is in a frequency range above 200 kHz.

5. The system as claimed in claim 1, wherein the feedback path has a filter frequency that is lower than a minimum chopper frequency of the variable chopper frequency by at least a factor of 2.

6. The system as claimed in claim 1, wherein the feedback path comprises a demodulator, which is configured to operate based on the chopper signal, and an integrator.

7. The system as claimed in claim 1, further comprising:

a spinning current Hall sensor, wherein an output of the spinning current Hall sensor is coupled to an input of the chopper modulator, wherein the spinning current Hall sensor is configured to be operated at a variable spinning frequency that is an integer multiple of the variable chopper frequency.

8. A method, comprising:

providing a chopper signal having a variable chopper frequency to a chopper arrangement, and providing feedback from an output of the chopper arrangement to a chopped apparatus to compensate for ripples or offsets caused by the variable chopper frequency.

9. The method as claimed in claim 8, wherein the feedback is configured to set an offset of the chopped apparatus.

10. The method as claimed in claim 8, wherein the variable chopper frequency has a repetition rate at which chopper frequencies repeat, and wherein the feedback has a filter frequency that is lower than the repetition rate by at least a factor of 2.

11. The method as claimed in claim 8, wherein the variable chopper frequency is in a frequency range above 200 kHz.

12. The method as claimed in claim 8, wherein the feedback has a filter frequency that is lower than a minimum chopper frequency of the variable chopper frequency by at least a factor of 2.

13. The method as claimed in claim 8, wherein the providing of the feedback comprises demodulating an output signal of the chopper arrangement based on the chopper signal, and integrating the demodulated output signal.

14. The method as claimed in claim 8, further comprising:

operating a Hall sensor using a spinning current technique, wherein an output of the Hall sensor is coupled to an input of the chopper arrangement, wherein the spinning current technique is operated at a variable spinning frequency that is an integer multiple of the variable chopper frequency.

* * * * *